(12) United States Patent
Warrington

(10) Patent No.: US 8,606,837 B2
(45) Date of Patent: Dec. 10, 2013

(54) DIGITAL SIGNAL PROCESSING

(75) Inventor: John Patrick Warrington, Oldham (GB)

(73) Assignee: Calrec Audio Ltd., West Yorkshire (GB)

( * ) Notice: Subject to any disclaimer, the term of this patent is extended or adjusted under 35 U.S.C. 154(b) by 571 days.

(21) Appl. No.: 12/446,223

(22) PCT Filed: Oct. 19, 2007

(86) PCT No.: PCT/GB2007/004006
§ 371 (c)(1),
(2), (4) Date: Jun. 14, 2010

(87) PCT Pub. No.: WO2008/047139
PCT Pub. Date: Apr. 24, 2008

(65) Prior Publication Data
US 2010/0299380 A1 Nov. 25, 2010

(30) Foreign Application Priority Data
Oct. 20, 2006 (GB) .................................. 0620819.3

(51) Int. Cl.
*G06F 17/17* (2006.01)
(52) U.S. Cl.
USPC ........................................................ 708/313
(58) Field of Classification Search
None
See application file for complete search history.

(56) References Cited

U.S. PATENT DOCUMENTS

| 4,809,207 | A | 2/1989 | Nillesen |
| 5,289,546 | A * | 2/1994 | Hetherington ............... 381/104 |
| 7,221,724 | B2 * | 5/2007 | Schell ........................... 375/355 |
| 7,376,690 | B2 * | 5/2008 | Van Den Enden et al. ... 708/313 |
| 2004/0054707 | A1 | 3/2004 | Yamada |
| 2005/0117756 | A1 | 6/2005 | Shigyo et al. |
| 2010/0299380 | A1 * | 11/2010 | Warrington ................... 708/290 |

FOREIGN PATENT DOCUMENTS

| EP | 0932253 A | 7/1999 |
| JP | 61-218217 A | 9/1986 |
| JP | 2002-345072 A | 11/2002 |
| WO | 9921189 A1 | 4/1999 |

* cited by examiner

*Primary Examiner* — David H Malzahn
(74) *Attorney, Agent, or Firm* — Peter A. Nieves; Sheehan Phinney Bass + Green PA

(57) ABSTRACT

A digital signal processor for interpolating a gain (coefficient) to be applied to a digital signal, the processor including: first memory means for storing a target gain coefficient; second memory means for storing a current gain coefficient; response determining means for determining an output gain coefficient based on the target gain coefficient and the current gain coefficient; means for storing the output gain coefficient in the second memory means in place of the current gain coefficient, to be used as the current gain coefficient in subsequent operations. In this way, a gain coefficient interpolator can be implemented using hardware rather than the previous DSP software approach.

11 Claims, 2 Drawing Sheets

DIGITAL SIGNAL PROCESSING

The present invention relates to a digital signal processor and of digital signal processing method. Typically the invention may be used in mixing consoles, of the kind where a large number of input signals (channels) are processed and combined to create a variety of outputs. These are used in applications such as television and radio broadcasting, music recoding, sound reinforcement and public address systems, theatre, and film post production. More specifically the invention relates to a structure and method for interpolating one or more gain coefficient(s) be applied to respective channels to enable smooth gain control during the processing of the signals.

The processing of digital signals typically requires that their gain be controlled. This is usually achieved by multiplying each digital signal by a gain coefficient. If the value of the gain coefficient applied to a given signal is changed abruptly, it is possible that offensive artefacts are created, for example audio noise (in the case of audio signals). This can be minimised by controlling the rate of change of the gain coefficient.

At present digital processing equipment implements this by using commercially available specialised digital signal processing integrated circuits (DSP devices) to apply gain to a digital audio sample stream. These are essentially software-controlled processors. One such device is a Shark DSP ('). If gain coefficient interpolation is required, then a DSP device is programmed to apply interpolation. If there are many sample streams to control, then the burden of interpolating the gain coefficients may consume a significant proportion of the DSP device's processing capacity, or worse, require the addition of extra DSP devices.

DSP devices comprise permanent, fixed hardware architecture and are programmable by software which enable them to provide ultra-fast instruction sequences, processing signals in real time. For example, they can handle audio signals of up to 20 kilohertz, at typical sampling rates of 48 kHz-192 kHz. However, their design means that they are flexible enough to be able to perform a wide variety of tasks, but are not necessarily very efficient at performing a single task a great many times. In a digital mixer, a small number of tasks are required to be performed a very large number of times and therefore vast arrays of DSP devices are required, housed on multiple printed circuit cards; typically 6 to 8 of such devices per card. However, because such mixers contain a large number of components with a large number of relatively complex interconnects, they are relatively expensive to construct and are intrinsically unreliable. Furthermore, they consume a large amount of energy, and consequently generate a large quantity of heat.

It is an object of the present invention to provide a system of digital signal processing which overcomes or alleviates the above described drawbacks.

In its broadest sense, the present invention provides a system in which interpolation is applied to a large number of gain coefficients, using fixed architecture, requiring no software or DSP processing.

Accordingly, in a first aspect, the present invention provides a digital signal processor for interpolating a gain to be applied to a digital signal, the process including:

first memory means for storing a target gain coefficient;
second memory means for storing a current gain coefficient;
response determining means for determining an output gain coefficient based on the target gain coefficient and the current gain coefficient;
means for storing the output gain coefficient in the second memory means in place of the current gain coefficient, to be used as the current gain coefficient in subsequent operations.

In this way, a gain coefficient interpolator can be implemented using hardware rather than the previous DSP software approach. Preferably, the digital signal processor is implemented using a field programmable gate array (FPGA).

Field-programmable gate arrays (FPGA) are integrated circuits that can be set up by a user after manufacture, enabling the user to tailor such to their own individual needs. Effectively, the hardware architecture (i.e. circuit design to be produced) of a FPGA is customisable by a user. Once set up, such devices run using solely fixed architectures comprising an array of configurable logic blocks and routing channels. This has the advantage that they can handle a larger number of different tasks and can be configured to handle bespoke tasks.

The above description refers only to a single target coefficient i.e. by implication a single audio channel where the present invention is part of an audio mixing desk. However, in practice, such systems typically comprise many audio channels (up to, for example, 500) and so the first and second memory means may be set up to store multiple gain coefficients, typically 1 per required channel. This will be referred to in more detail below, but for simplicity, only a single channel will be referred to in some of the following explanation.

Preferably the response determining means includes a filter. The design (i.e. response) of the filter may be chosen so as to provide any desired degree of interpolation. The response determining means is interpolating between the current gain coefficient and the target gain coefficient to provide the desired output gain coefficient, and so typically is acting on the difference between the target and current gain coefficients.

One relatively simple filter response which has been found to be suitable in some embodiments of the present invention, is a first order filter. Applying a first-order filter to the gain coefficient value, which, if correctly tuned, will have the effect of smoothly ramping the gain value, from its starting value to the new value, over time. The first order filter has the desirable property of taking the same time to ramp between values irrespective of the difference between them.

The time constant of the filter may be chosen to be somewhat greater than the sample period of the digital signal(s) to which the gain coefficient is to be applied. This will mean that the output gain coefficient will always be less than the target gain coefficient and therefore the signal to which the gain coefficient is applied cannot reach its desired value in a single sample period. This helps to avoid the artefacts problem previously referred to. In practice, the response time of the filter will be selected to be significantly greater than the sample period of the digital signal. In typical cases, the response time of the filter will be greater than a hundred times the sample period of the digital signal, preferably at least 250 times the sample period and most preferably 500 times the sample period, although even greater response times could be chosen if required.

The first order filter for limiting the rate of change of gain coefficient may include a first input for receipt of the target gain coefficient value $x_n$ and an output for delivering the interpolated output gain coefficient value $y_n$ (for use in modifying the gain of a digital signal), a subtracter for computing the difference between the target gain coefficient $x_n$ the previously interpolated outputted gain value $y_{n-1}$, (which in the first instance, will be the current gain coefficient value $y_{n-1}$, a multiplier for multiplying the resultant value $x_n - y_{n-1}$ by a stored filter constant K which defines the response of the filter (K $(x_n-y_{n-1})$), and an adder which then adds the said previously interpolated outputted gain value $y_{n-1}$ to the resultant multiplied value K $(x_n-y_{n-1})$ to create the interpolated filter output $y_{n-1}$+K $(x_n-Y_{n-1})$. $y_{n-1}=y_n$.

The first memory means for the target gain coefficient may be an input RAM, which may be a dual port input RAM. The second method means for the current gain coefficient may be an output RAM.

As mentioned previously, each of these memory means may include sufficient storage for a plurality of gain coefficients, each relating to a respective audio channel. Typically, this may be as many as 500 or 1000 audio channels, and so the memory means will be sized accordingly.

The processor may include a system clock which controls each component to enable a calculation to take place during each cycle. It may also include a sample clock for digital input signals. The ratio of the frequency of the system clock to the sample clock may determine the number of interpolations N carried out by the filter in a given digital sample. The system clock may be a high-speed system clock.

The processor may include an edge detector which detects a predetermined edge on the sample clock and generates a pulse which resets the counter, that is sets the counter output to 0 to commence a new interpolation of gain value.

For a first order filter, a filter constant K defines the time constant of the filter and may be selected to control the rate of interpolation limiting the rate of change of gain coefficient in order to keep artefacts below a predetermined level. The filter may include a store (e.g. third memory means) for storing a plurality of selectable K values. The store may be in the form of a dual port RAM.

Additionally or alternatively, a different K value may be used or selected for subsequent interpolations. This would be one way to achieve desired audio effects, for example, a fade-in or fade-out.

The filter may include means to write new gain coefficients into the filter, which may be stored in the input RAM. The writing of the new gain coefficients may occur asynchronously with the system clock.

The filter may include a comparator which detects the counter value and has means to hold the counter when the required number N of gain values have been detected for a given sample clock edge. As mentioned previously, the digital signal processor may provide for multiple signals to be processed at the same time i.e. with different gain coefficients for each signal, if desired. In order to increase the efficiency of the processing, preferably the process is set up to utilise pipeline registered buffering. What this means is that the processor includes one or more pipeline registers, located at appropriate points in the circuit, such that a signal is "stepped through" the circuit in a controlled fashion. This enables a portion of the processor circuit to be operating on a first signal, whilst simultaneously a second portion of processor circuit may be operating on a second signal (i.e. relating to a second audio channel and so on).

The digital signal processor may be a circuit on a FPGA used in a mixing console and in a preferred embodiment a digital mixing console. The system clock rate may be 192 MHz and the digital signal sample may be 48 KHz which may enable up to 4000 interpolations per second. It is to be appreciated that a higher clock rate will enable more gain values to be interpolated. This is achieved with a small number of components synthesised on an FPGA and would only require a small fraction of the FPGA resources available for other functions. A known DSP device, clocking at the same rate, is only able to interpolate half the number of gain coefficients and would be completely occupied doing so.

Accordingly, in a further aspect, the present invention provides a digital signal processing module including a digital signal processor according to the first aspect of the invention and means for applying the output gain coefficient to a digital signal. Also, in a further aspect, the present invention is a digital audio mixing desk including one or more digital signal processors and/or digital signal processing modules according to the first or second aspects of the invention.

In a further aspect, the present invention provides a method of interpolating a gain to be applied to a digital signal, the method including the steps of:

1. storing a target gain coefficient in a first memory means;
2. storing a current gain coefficient in a second memory means;
3. retrieving the target and current gain coefficients from the first and second memory means and interpolating between them according to a predetermined algorithm in order to produce an output gain coefficient;
4. storing the output gain coefficient in the second memory means in place of the current gain coefficient.

Preferably the method includes the further step of repeating steps 1-4 for subsequent operations.

By way of example only, embodiments of the invention will now be described with reference to the accompanying drawings in which:

FIG. 1 is a block diagram showing the principles of the operation of a circuit according to the present invention. FIG. 1 illustrates the invention using only a single audio channel, but as mentioned previously in practice the invention will be implemented to accommodate many audio channels.

In principle, this embodiment of the invention consists primarily of a pair of memory means, M1 and M2, and a response determining means F. If a user wishes to apply a particular gain to an audio signal (e.g. again selected by operating a knob or slide, (often referred to as a fader) on a mixing desk) then a target gain coefficient $G_t$ is input to the first memory M1. The current gain coefficient $G_c$ being applied to that audio signal at that time will already be stored in memory M2. In principle, the invention compares the target gain coefficient $G_t$ with the current gain coefficient $G_c$ using comparator C and then applies a desired interpolation function to the output of that comparator. In some embodiments of the present invention, the chosen interpolation function will be a first order filter, as previously described. That interpolation function and output gain coefficient $G_o$, which in many cases is intended to be an intermediate value between the current gain coefficient $G_c$ and the target gain coefficient $G_t$. That output gain coefficient $G_o$ can then be mixed with the audio signal to which it is to be applied, to produce a resulting audio output.

Figure 1:
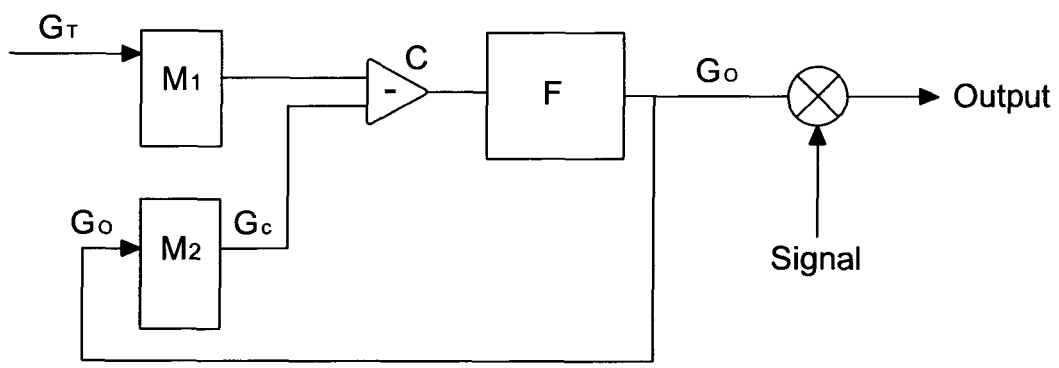
FIG. 1 is a block diagram showing the operation of a digital signal processor according to an embodiment of the present invention.
Figure 2:
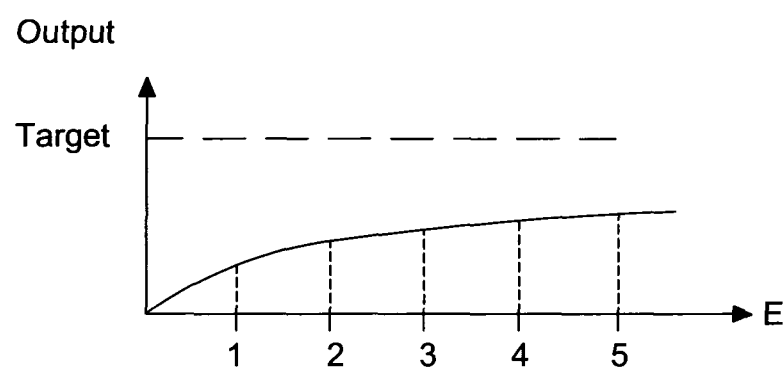
FIG. 2 is a graph of digital signal output, showing a typical response which could be selected using the present invention.

FIG. 2 illustrates how output might vary with time when using the present invention. The target output value selected by a user is shown on the graph by the dashed line. In general, the output changes incrementally at a rate controlled by K. In this example, it is assumed that the starting output value is 0, but of course in practice it may be any value. As explained previously, the time constant of the filter F mean some examples be chosen to be much longer than the sample period of the audio signal in question. In this example, with a first order filter response being used, the increase in the output value is inverse exponential, but any other suitable response may be used. For example, the response time of the filter may be selected so that the output value increases by e.g. 1% over a sample period. This value may of course be varied as required. In the graph shown in FIG. 2 only the first 5 sample periods are shown, but of course in practice the response would take placed over many more sample periods. For example, if the overall desired response time of the processor was e.g. 10 milliseconds (the time taken to reach the desired target coefficient and therefore desired signal output value) then that might take place over 500 sample periods.

Figure 3:
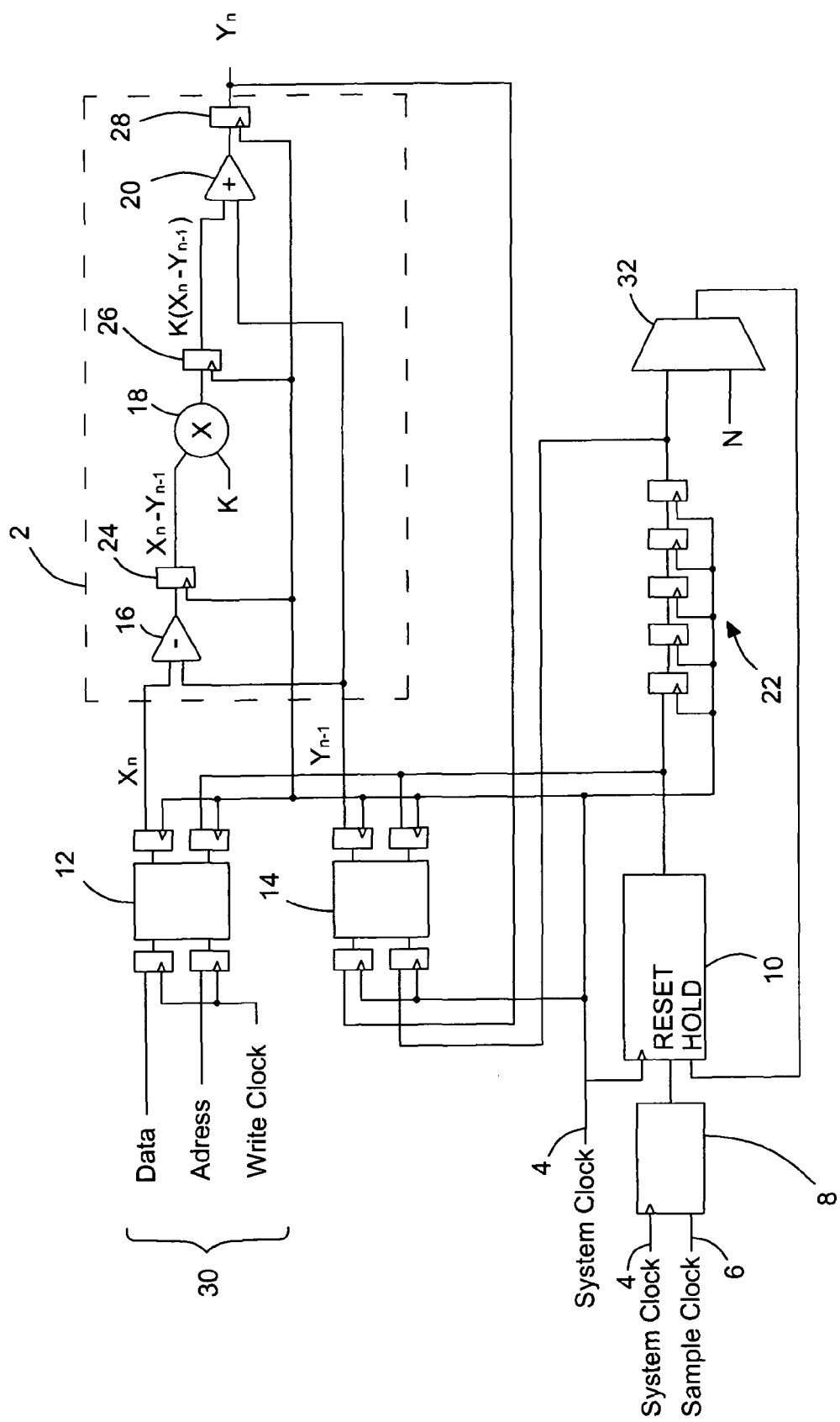
FIG. 3 is a schematic diagram illustrating a circuit within an FGPA device for interpolating a large number of digital signal values.

In accordance with one embodiment of the present invention as shown in FIG. 3 at least one circuit is implemented on an FPGA for interpolating a large number of sample values using a first order filter. The following equation represents a first-order filter $$y_n = K \cdot x_n + (1-K) \cdot y_{n-1}$$

where $y_n$ represents the filter output, $x_n$ the input, and $y_{n-1}$ the previous filter output. The constant K defines the time constant of the filter. It controls the rate of interpolation, and is selected to limit the rate of change of gain coefficient such that artefacts are kept below a desired level, such as for example below an audible level. This equation is written $$Y_n = y_{n-1} + k(x_n - y_{n-1}) \cdot y_{n-1}$$

which is the form of equation used in the present invention.

The circuit includes a control system including a high-speed system clock 4 and a sample clock 6 for the digital input signals.

The rate at which system clock 4 operates is much higher in frequency than that of the sample clock 6. The ratio of the two determines the number of interpolation operations that are carried out. If, for example, the digital signal sample rate is 48 kHz and the system clock rate is 192 MHz, then the number of interpolations, N, that are carried out is given by $$N = \frac{f_{system\_clock}}{f_{sample\_rate}} = \frac{192 \times 10^6}{48 \times 10^3} = 4000.$$

The circuit includes an edge detector 8, counter 10, an input dual port RAM (input DPRAM) 12, an output dual port DPRAM (output RAM) 14, a subtracter 16, a multiplier 18, an adder 20, a series of pipeline delay registers 22 and a plurality of further registers 24, 26, 28. These components are interconnected in accordance with the invention to provide the filter circuit shown in the FIG. 3.

The circuit also includes a control interface 30 which is adapted to write new gain coefficients into the input DPRAM 12, both the input and the output DPRAM's 12, 14 are designed to store N gain coefficient values of bit-width W. The bit-width determines the resolution of the gain coefficient. A suitable value for digital audio gain coefficients is 32 bits, giving a dynamic range of 192 dB. The output DPRAM 14 is used to store the previous filter output $y_{n-1}$.

The circuit operates as follows:

The edge detector 8 detects a rising edge on the sample clock 6 and generates a pulse which clears the counter 10 to 0. After the counter is reset, the counter output is set to 0. The output of the counter 10 provides addresses for both the input DPRAM 12 and the output DPRAM 14. Two clock cycles later the desired gain value or filter input $x_n$ from address 0 is retrived from the input DPRAM 12 and the previous filter output $y_{n-1}$ is retrieved from the output DPRAM 14. Both the new filter input $y_n$ and the previous filter output $y_{n-1}$ are applied to the filter 2, via the input of the subtractor 16 and the calculation $x_n - y_{n-1}$ takes place. The result of this calculation is stored in the succeeding register 24. During the following clock cycle this result is multiplied in the multiplier 18 by the constant K, representing the first-order filter coefficient. The result K ($x_n - y_{n-1}$) is stored in the succeeding register 26. Finally the previous filter output $y_{n-1}$ is added in the adder 20 $y_{n-1} + K (x_n - y_{n-1})$. $y_{n-1}$ to create the new filter output $y_n$.

The new filter output $y_n$ is stored in register 28 and is the interpolated gain value used to directly modify the gain of a digital signal stream.

The new filter output $y_n$ is stored in the output DPRAM 14 as the previous filter output $y_{n-1}$ for use in subsequent calculation the next time the interpolation is applied to the gain value in the input DPRAM 12 at address 0. To this end the new filter output $y_n$ is subjected to five pipeline delays to compensate for the pipeline delays 22 of the memory access and filter calculation, on its journey to the output DPRAM 14.

The design is pipelined in this manner in order to enable one filter calculation per clock cycle. Operation continues as the counter counts up to N, calculating a new interpolation gain value every clock cycle until the counter 10 reaches N gain coefficient values.

The circuit is further adapted such that if the frequency of the system clock 4 is higher than what is needed for the required number of gain values that require interpolating, means is provided to arrest the counter 10, after the required number of interpolations, to prevent the possibility of the counter 10 wrapping and re-starting the interpolation process before the next sample clock rising edge. This would have the disadvantage of an apparent interpolation rate higher than that defined by the first-order filter value K. The means comprises a comparator 32 which detects when the counter 10 value after the pipeline registers 22 is equal to N, the required number of gain values. At this point a signal is sent to hold the counter 10 in order to prevent further interpolations until the next sample clock 4 rising edge.

Although a fixed constant K has been described the circuit could be further adapted to include a further DPRAM (not illustrated) adapted to store additional, different K values, enabling different interpolation rates to be selected for each gain value.

It is to be understood that the invention is not intended to be restricted to the details of the above described embodiments which are described by way of example only.

The invention claimed is:

1. A digital signal processing module that includes a digital signal processor for interpolating a gain coefficient to produce an interpolated output gain coefficient $y_n$, and a means configured to use the interpolated output gain coefficient $y_n$ to modify the gain of a digital audio signal, wherein the digital signal processor comprises:
   a first memory configured to store a target gain coefficient $x_n$;
   a second memory configured to store a current gain coefficient;
   response determining means configured to determine the interpolated output gain coefficient $y_n$ based on the target gain coefficient $x_n$ and the current gain coefficient; and
   means for storing the interpolated output gain coefficient $y_n$ in the second memory in place of the current gain coefficient, to be used as the current gain coefficient in subsequent operations;
   wherein the response determining means comprises a first order filter configured to limit the rate of change of the gain coefficient which includes a first input for receipt of the target gain coefficient value $x_n$ and an output configured to deliver the interpolated output gain coefficient $y_n$ to the means configured to use the interpolated output gain coefficient $y_n$ to modify the gain of a digital audio signal, a subtractor configured to compute the difference between the target gain coefficient $x_n$ and a previously interpolated outputted gain value $y_{n-1}$ (which in the first instance, will be the current gain coefficient), a multiplier configured to multiply the resultant value $x_n - y_{n-1}$ by a stored filter constant K which defines the response of the filter, and an adder configured to add the previously interpolated outputted gain value $y_{n-1}$ to the resultant multiplied value $K(x_n - y_{n-1})$ to create the interpolated filter output $y_n = y_{n-1} + K(x_n - y_{n-1})$.

2. The digital signal processing module according to claim 1 wherein the digital signal processor is implemented using a field programmable gate array, FPGA.

3. The digital signal processing module according to claim 1 wherein a time constant of the filter, defined by the filter constant K, is chosen to be greater than the sample period of the digital audio signal.

4. The digital signal processing module according to claim 3 wherein the response time of the filter is greater than a hundred times the sample period of the digital audio signal.

5. The digital signal processing module according to claim 1 wherein each of the first and second memories includes sufficient storage for a plurality of gain coefficients, each relating to a respective audio channel.

6. The digital signal processing module according to claim 1 wherein the filter includes a third memory for storing a plurality of selectable filter constant (K) values.

7. The digital signal processing module according to claim 1, further comprising one or more pipeline registers, located at appropriate points in the processor, such that a signal is stepped through by the processor in a controlled manner.

8. The digital signal processing module according to claim 7 wherein the pipeline registers enable the processor to function such that a first portion of the processor can operate on a first signal, whilst simultaneously a second portion of processor can operate on a second signal.

9. A digital audio mixing desk including a digital signal processing module according to claim 1.

10. A method of interpolating a gain coefficient to produce an interpolated output gain coefficient $y_n$ and using the interpolated output gain coefficient $y_n$ to modify the gain of a digital audio signal, the method including the steps of:
  (1) storing a target gain coefficient $x_n$ in a first memory;
  (2) storing a current gain coefficient $y_{n-1}$ in a second memory;
  (3) retrieving the target and current gain coefficients from the first memory and the second memory and interpolating between them in order to produce an interpolated output gain coefficient $y_n$ according to the equation $y_n = y_{n-1} + K(x_n - y_{n-1})$, where K is a constant;
  (4) storing the interpolated output gain coefficient $y_n$ in the second memory in place of the current gain coefficient $y_{n-1}$; and
  (5) using the interpolated output gain coefficient $y_n$ to modify the gain of a digital audio signal.

11. The method according to claim 10 including the further step of repeating steps 1-5 for subsequent operations.

* * * * *